(12) United States Patent
Halik et al.

(10) Patent No.: US 7,057,206 B2
(45) Date of Patent: Jun. 6, 2006

(54) SILICON PARTICLES AS ADDITIVES FOR IMPROVING CHARGE CARRIER MOBILITY IN ORGANIC SEMICONDUCTORS

(75) Inventors: Marcus Halik, Erlangen (DE); Günter Schmid, Hemhofen (DE); Hagen Klauk, Erlangen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/974,774

(22) Filed: Oct. 28, 2004

(65) Prior Publication Data

US 2005/0104060 A1 May 19, 2005

Related U.S. Application Data

(63) Continuation of application No. PCT/DE03/01210, filed on Apr. 11, 2003.

(30) Foreign Application Priority Data

Apr. 29, 2002 (DE) ................................ 102 19 121

(51) Int. Cl.
*H01L 29/08* (2006.01)
(52) U.S. Cl. .................. 257/40; 438/99; 257/E51.028; 257/E51.029
(58) Field of Classification Search ................ 438/99; 257/40, E51.028, E51.029
See application file for complete search history.

(56) References Cited

U.S. PATENT DOCUMENTS 4,093,562 A * 6/1978 Kishimoto .................. 252/511

| 5,500,537 A | 3/1996 | Tsumura et al. |
| 2002/0084504 A1 | 7/2002 | Narayan |
| 2003/0092214 A1* | 5/2003 | Klauk et al. ................ 438/99 |

FOREIGN PATENT DOCUMENTS

| EP | 0 716 459 A2 | 6/1996 |
| WO | WO 00/20916 A2 | 4/2000 |

OTHER PUBLICATIONS

Tada, et al., "Characteristics of Junction Devices Utilizing $C_{60}$ Doped Conducting Polymer", Technology Reports of the Osaka University, vol. 45, No. 2224 (Oct. 1995) pp. 161-166.

Blom, et al., "Electrical Characterization of Electroluminescent Polymer/Nanoparticle Composite Devices", Applied Physics Letters, vol. 73, No. 26, Dec. 28, 1998, The Netherlands.

(Continued)

*Primary Examiner*—Trung Dang
(74) *Attorney, Agent, or Firm*—Edell, Shapiro & Finnan, LLC

(57) ABSTRACT

The invention relates to a semiconductor device having a semiconductor path made from an organic semiconductor material. Semiconductor particles or semiconductor clusters are distributed randomly in the organic semiconductor material. The semiconductor particles and/or semiconductor clusters can also be linked by linker molecules. The addition of semiconductor particles to the organic semiconductor material makes it possible to improve the electrical properties, for example, of a field-effect transistor has a semiconductor path of this nature.

13 Claims, 2 Drawing Sheets

OTHER PUBLICATIONS

Shipway, et al., "Nanoparticle Arrays on Surfaces for Electronic, Optical and Sensor Applications," ChemPhysChem 2000, 1; pp. 18-52.

Ariga, et al., "Alternately Assembled Ultrathin Film of Silica Nanoparticles and Linear Polycations," Chemistry Letters 1997, pp. 125-126.

* cited by examiner

SILICON PARTICLES AS ADDITIVES FOR IMPROVING CHARGE CARRIER MOBILITY IN ORGANIC SEMICONDUCTORS

CROSS REFERENCE TO RELATED APPLICATIONS

This application is a continuation of PCT/DE03/01210, filed Apr. 11, 2003, and titled "Silicon Particles as Additives for Improving the Charge Carrier Mobility in Organic Semiconductors," which claims priority under 35 U.S.C. §119 to German Application No. DE 10219121.2, filed on Apr. 29, 2002, and titled "Silicon Particles as Additives for Improving the Charge Carrier Mobility in Organic Semiconductors," the entire contents of each are hereby incorporated by reference.

FIELD OF INVENTION

The invention relates to a semiconductor device having a semiconductor path made from an organic semiconductor material, and to a method for fabricating a semiconductor device.

BACKGROUND

Semiconductor chips have found widespread use in a wide range of technical applications. However, they are still very complex and expensive to fabricate. Although silicon substrates can be thinned to very low layer thicknesses, so that they become flexible, these methods are expensive, with the result that flexible or curved microchips are only suitable for applications in which high costs are acceptable. The use of organic semiconductors offers the possibility of inexpensive fabrication of microelectronic semiconductor circuits on flexible substrates. One example of an application is a thin film with integrated control elements for liquid crystal screens. A further application is in transponder technology, in which for example information about a product is stored on what are known as tags.

Organic semiconductors are readily accessible and can be patterned very easily, for example, using printing processes. However, the use of organic semiconductors of this type is currently limited by the low mobility of the charge carriers in the organic polymer semiconductors. This mobility is currently at most 1 to 2 $cm^2/Vs$. The maximum operating frequency of transistors, and therefore of the electronic circuit, is limited by the mobility of the charge carriers. Although mobilities on the order of magnitude of $10^{-1}$ $cm^2/Vs$ are sufficient for driver applications in the production of TFT active matrix displays, organic semiconductors have not hitherto proven suitable for radiofrequency applications. For technical reasons, wireless transmission of information (RF ID systems) can only take place above a certain minimum frequency. In systems which draw their energy directly from the electromagnetic alternating field and therefore also do not generate any voltage of their own, carrier frequencies of 125 kHz or 13.56 MHz are in widespread use. Systems of this type are used, for example, for identifying or labelling articles in smartcards, identification tags, or electronic postage stamps.

Processes in which semiconducting molecules, for example, pentacene or oligothiophenes, can be deposited as far as possible in an ordered manner have been developed for improving the charge carrier transport in organic semiconductors. This is possible, for example, by vacuum sublimation. Suitable deposition of the organic semiconductor leads to an increase in the crystallinity of the semiconductor material. The improved π—π overlap between the molecules or the side chains allows the energy barrier for charge carrier transport to be reduced. By substituting the semiconducting molecular units by bulky groups during the deposition of the organic semiconductor from the liquid or gas phase, it is possible to produce domains which have liquid crystal properties. Furthermore, synthesis methods in which as high a regioregularity as possible is achieved in the polymer by the use of asymmetric monomers have been developed.

The electrical conductivity of many organic semiconductor materials, as with inorganic semiconductors, can be increased by the introduction of suitable dopants. However, there are problems with achieving positional selectivity during the doping. In the organic semiconductors, the dopants are not tied to a specific position and can move freely within the material. Even if the doping process can originally be restricted to a defined region, for example, the regions around the source and drain contacts, the dopants subsequently migrate through the entire semiconductor layer under the influence of the electric field, which is applied between the source and drain contacts in order to operate the transistor.

It is known that electrically semiconducting polymers are used, for example, in field effect transistors or electronic components which are based on a field effect.

For organic polymers to be used in field effect transistors or similar electronic components, it is necessary for the polymer to behave like an insulator when no electric field is applied, while it forms semiconductor properties or a conduction channel under the influence of an electric field. For example, polyphenylenes or naphthalene derivatives have such properties. However, owing to their insolubility, these are not processable, i.e., these compounds cannot be used to produce field effect transistors.

A semiconductor device having a semiconductor path made from an organic semiconductor material, which is relatively easy to produce with improved electrical properties, in particular, electrical conductivity, is desirable.

SUMMARY

A semiconductor device can have a semiconductor path made from an organic semiconductor material in which semiconductor particles and/or semiconductor clusters are present in the organic semiconductor material along the semiconductor path.

Providing semiconductor particles and/or semiconductor clusters in the organic semiconductor material allows the mobility of the charge carriers to be increased considerably compared to corresponding pure organic semiconductors. The conductivity of the organic semiconductor material is dependent on the level of semiconductor particles and/or semiconductor clusters in the organic semiconductor material and on the material of which the semiconductor particles and/or semiconductor clusters consist. If semiconductor particles and/or semiconductor clusters made from different materials are provided in the semiconductor path, the electrical conductivity is also influenced by the mixing ratio of the components. In this way, the electrical conductivity of the semiconductor path can be set to any desired level. As a result, for example, the threshold voltage and the switch-off performance of transistors can be influenced and/or the threshold voltage and the switch-off performance of the transistors can be adjusted by means of the type and quantity of semiconductor particles and/or semiconductor clusters used.

The term semiconductor path denotes a conduction path between two contacts, which is composed of an organic semiconductor material. The charge carriers, electrons or holes, are injected into the semiconductor path at the first contact, move through the semiconductor path and are extracted again from the conductor path at the second contact. In the context of the invention, along the semiconductor path means a direction or a path along which the charge carriers move from the first contact to the second contact.

The term semiconductor particles is understood as meaning individual particles which have a semiconductor material, for instance, an inorganic semiconductor material. The particles may per se be in any desired form, i.e., in the shape of spheres, plates or rods. The diameter of the particles is, for example, from 2 nm to 100 µm, for instance, from 2 to 100 nm. The semiconductor particles may be in the form of individual particles or may also form agglomerates including a plurality of particles.

Semiconductor clusters are understood as meaning compounds with at least three metal atoms, each of the metal atoms being chemically linked to at least two other metal atoms by means of a metal-metal bond. The metals of the semiconductor cluster may be identical or different. The metals can be stabilized at their free co-ordination sites by ligands, for example, carbonyl or cyclopentadienyl groups. The metals used in the semiconductor clusters may preferably be elements from the transition groups, for example, Ru, Co, Rh, Pt, Au, Pd, or Fe.

The semiconductors which form the semiconductor particles may be elemental semiconductors from Group IV of the periodic system, such as Si and Ge, and III/V semiconductors, such as GaAs or InP, IIb/VI semiconductors, for example compounds of zinc or cadmium with oxygen, sulphur, selenium or tellurium, Ib-VII semiconductors, such as CuCl, and further semiconductors, such as, for example, certain modifications of S, Se, Te and P or semiconductors made from compounds such as $Cu_2O$, $TiO_2$, GaSe. The conductivity of the semiconductor materials can be influenced by suitable doping, in order, for example, to obtain p-Si or n-Si.

Details relating to properties and syntheses of microparticles and nanoparticles are to be found, for example, in A. F. Hollemann, E. Wiberg, N. Wiberg, Lehrbuch der anorganischen Chemie [Textbook of Inorganic Chemistry], Walter de Gruyter Verlag, Berlin, 1985, page 767 or J. H. Fendler, Nanoparticles and Nanostructure Films—Preparation, Characterisation and Application, Wiley-VCA, 1998.

The organic semiconductor material used may per se be any organic materials which have semiconductor properties. Examples of suitable compounds are condensed aromatics, such as anthracene, tetracene or pentacene, polymeric aromatic compounds, such as polyphenylene or polynaphthalene derivatives, electrically semiconducting compounds based on polythiophene, for example, poly-3-hexylthiophene-2,5-diyl, or electrically semiconducting compounds based on polyvinylthiophene or polyaniline. In addition to the compounds listed, it is also possible to use other organic semiconductor compounds. The organic semiconductor materials may be doped, for example, with camphorsulphonic acid or polystyrenesulphonic acid.

The materials used to produce the semiconductor path of the semiconductor device according to the invention are readily accessible and can in some cases even be purchased from commercial suppliers. The organic semiconductor materials or precursors for the production of the organic semiconductor materials are generally readily soluble in organic solvents. It is also possible to produce solutions or suspensions from the semiconductor particles or semiconductor clusters. To improve their solubility or dispersability in the solvent, the semiconductor particles may also be surface-modified, for example, by nonpolar alkyl chains being co-ordinatively bonded to the surface of the nanoparticles by a corresponding group. The components of the semiconductor path, organic semiconductors and semiconductor particles and/or semiconductor clusters can therefore be provided in dissolved form or as a suspension and applied to a substrate in liquid form. In this way, the semiconductor path of the semiconductor device according to the invention can be produced, for example, by simple printing processes, making the semiconductor element significantly easier and less expensive to produce.

In the region of the contacts, the semiconductor particles and/or semiconductor clusters considerably reduce the contact resistance. If the particle material and the material of the contacts have different work functions for the charge carriers, asymmetrical charge carrier diffusion processes occur at the contact surface between the particles, on the one hand, and the material of the contacts on the other hand. On account of the high electrical conductivities in the two materials, the interface potential between the particles and the contact material which forms is compensated for over very short distances, a few tenths of a nanometer. This leads to high electric field strengths between the particles and the contact material of the order of magnitude of approximately $10^7$ to $5 \times 10^7$ V/cm. This electric field is superimposed on the field, which builds up at the transitions between semiconductor and contact material. The increased electric field strength leads to a narrower potential barrier at the contact surface and therefore, to an increase in the tunnelling probability or to a tunnelling current between semiconductor and contact material. The increased tunnelling current corresponds to a reduction in the contact resistance. The increase in the field strength at the contact surface is more pronounced as the difference between the work function of the particle material and the work function of the contact material rises.

The semiconductor particles and/or the semiconductor clusters are, for instance, randomly distributed in the volume of the organic semiconductor material. In this embodiment, the semiconductor particles and/or the semiconductor clusters are distributed uniformly throughout the whole of the organic semiconductor material. For this purpose, to produce the semiconductor path, for example, the organic semiconductor material and the semiconductor particles or the semiconductor clusters can be dissolved in a common solvent and applied jointly to a substrate. However, it is also possible to provide organic semiconductor material and semiconductor particles or semiconductor clusters in separate solutions or suspensions and for the solutions to be applied simultaneously to a substrate during the production of the semiconductor path. After the solvent has been evaporated, the semiconductor particles and/or semiconductor clusters are fixed in the organic semiconductor material, and there is also no longer any migration of the semiconductor particles or semiconductor clusters under the influence of an electric field.

According to another embodiment, the semiconductor particles and/or the semiconductor clusters are arranged substantially at one surface along the semiconductor path made from the organic semiconductor material. In this case, the semiconductor path can be produced such that a layer of semiconductor particles or semiconductor clusters is applied to a substrate, and then a layer of the organic semiconductor material is applied to the layer of semiconductor particles or semiconductor clusters. However, the procedure may also take place in reverse order, in which case, a layer of an organic semiconductor material is produced on a substrate, and then the semiconductor particles or semiconductor clusters are deposited on an uncovered surface, on the opposite side from the substrate of the organic semiconductor material. The semiconductor particles or semiconductor clusters are, for instance, arranged such that the contact surfaces between the first or second contact and organic semiconductor material are also covered by the semiconductor particles or semiconductor clusters. The surface at which the semiconductor particles and/or semiconductor clusters are arranged therefore generally extends between the first and second contacts.

In an exemplary embodiment, the semiconductor particles and/or semiconductor clusters are bonded by linker molecules. Linker molecules are molecules which have at least two groups, which can co-ordinatively bond to the surface of a semiconductor particle or a semiconductor cluster. The linker molecules, for instance, have a conjugated π-electron system arranged between the functional groups. The linker molecules open up further conduction routes within the organic semiconductor material, so that the conduction properties of the semiconductor path can be improved further. Furthermore, the linker molecules effect further fixing of the semiconductor particles or semiconductor clusters within the organic semiconductor material.

The linker molecules can be bonded to the surface of a semiconductor particle or semiconductor cluster by co-ordinate bonds, for which purpose the linker molecule includes, for example, thiol groups or amino groups. However, the linker molecules are, for instance, bonded to the semiconductor particle and/or the semiconductor cluster by a covalent bond. Semiconductor particles of this type can be obtained by firstly activating the surface of the semiconductor particles, e.g., by chlorination, and then reacting the activated semiconductor particles with suitable ligands, e.g., thiols, alcohols, amines or carbanions.

The semiconductor particles and/or semiconductor clusters are, for instance, arranged in isolated positions or as isolated agglomerates of semiconductor particles and/or semiconductor clusters in the organic semiconductor material. The mean spacing between the nanoparticles and/or nanoclusters or agglomerates of nanoparticles or nanoclusters can be selected within wide ranges. For example, a mean spacing in a range from approximately 0.1 nm to 5000 nm is suitable.

The semiconductor properties of the semiconductor path are substantially determined by the organic semiconductor material, the electrical conductivity properties of the organic semiconductor material being modified by the addition of semiconductor particles and/or semiconductor clusters. Therefore, the semiconductor particles and/or semiconductor clusters are, for instance, selected to form less than 50% by volume of the semiconductor path.

The semiconductor device is preferably designed as a transistor. To this end, the semiconductor path is supplemented by source electrode, drain electrode and gate electrode to form a transistor. The material selected for the contacts may preferably be a material with a high conductivity. Suitable examples include electrically conductive metals, such as, for example, gold, titanium or palladium, or an electrically conductive polymer, such as, for example, polyaniline doped with camphorsulphonic acid or poly(di-oxyethylene)thiophene doped with polystyrenesulphonic acid. The contact material should have as high an electrical conductivity as possible. Standard materials, such as silicon dioxide, aluminium oxide or an insulating polymer, such as polystyrene, polyethylene, polyester, polyurethane, polycarbonate, polyacrylate, polyimide, polyether, polybenzoxazoles, or mixtures of these compounds, can be used to insulate the gate electrode.

The semiconductor element according to the invention can be fabricated at very low cost from readily available materials and is therefore suitable, in particular, for use in devices which are subject to high cost pressures, such as labels for marketing goods. Therefore, the invention also relates to a method for fabricating the semiconductor device described above, in which a solution or suspension of an organic semiconductor and of semiconductor particles and/or semiconductor clusters in a solvent is produced, the solution is applied to a substrate and the solvent is evaporated to obtain a semiconductor path, and the semiconductor path is supplemented by further components to form a semiconductor element.

In this embodiment of the method according to the invention, the semiconductor particles and/or semiconductor clusters are distributed uniformly in the organic semiconductor of the semiconductor path. The joint solution of organic semiconductor material and semiconductor particles or semiconductor clusters can be produced first and then applied to the substrate. However, it is also possible to produce separate solutions or suspensions of organic semiconductor material and semiconductor particles or semiconductor clusters and to produce a common solution from these solutions or suspensions only on the substrate. In this embodiment of the method according to the invention, therefore, the semiconductor particles or semiconductor clusters are embedded in the volume of the organic semiconductor material.

According to another embodiment of the method for fabricating the semiconductor device described above, a first solution of an organic semiconductor in a solvent is produced, and a second solution or suspension including semiconductor particles and/or semiconductor clusters in a solvent is produced, so that separate solutions of organic semiconductor material and semiconductor particles and/or semiconductor clusters are used. As in the first embodiment of the method according to the invention, the solvents of the two solutions or suspensions may be identical or different. Then, as in the embodiment described above, a substrate is provided, and a layer stack including at least a first layer and a second layer is produced on the substrate. One of the first and second layers is produced from the first solution and the other layer is produced from the second solution, so that a semiconductor path is obtained. Then, as in the first embodiment of the method according to the invention, the semiconductor path is supplemented by further components to form a semiconductor device.

The substrate used in the fabrication of the semiconductor device according to the invention may be inflexible substrates such as, for example, carriers made from glass or quartz or also silicon wafers. However, flexible substrates, such as, for example, plastic films made, for example, from polystyrene, polyethylene, polyester, polyurethane, polycarbonate, polyacrylate, polyimide, polyether, or polybenzoxazoles, or alternatively paper, can be used. Components of the semiconductor device may already be defined on the substrate, such as, for example, source electrode, drain electrode and gate electrode, the gate electrode being insulated with a corresponding gate dielectric. Then, the solution or solutions, which includes the organic semiconductor material and the semiconductor particles and/or semiconductor clustersm are applied to the substrate. The solution can be applied, for example, by spinning, spraying, dip-coating processes, or, for instance, by printing processes. If a layer of semiconductor particles is produced first on the substrate, these particles may also be deposited, for example, by vapor deposition. Depending on the embodiment of the method according to the invention, it is possible for organic semiconductor material and semiconductor particles or semiconductor clusters to be applied to the substrate together or, in order to produce a layer structure, in successive steps. To produce a layer structure, it is either possible for the organic semiconductor material to be applied to the substrate first, followed by a layer of semiconductor particles or semiconductor clusters being applied to the layer of the organic semiconductor material, or for a layer of semiconductor particles or semiconductor clusters to be deposited on the substrate first, then a layer of the organic semiconductor material to be applied to the layer of semiconductor particles or semiconductor clusters. Finally, the semiconductor path is completed to form a semiconductor element, for example, by insulating layers or contacts being defined and deposited on the semiconductor path. Then, the semiconductor element is connected into a corresponding circuit by interconnects.

If the semiconductor particles and/or semiconductor clusters are to be bonded by linker molecules, the role of the linker molecules may preferably be performed in a separate solution, so that the nanoparticles and the linker molecules form a network on the substrate as a result of co-ordination, the semiconductor particles and/or semiconductor clusters in each case forming branching points in the network. However, it is also possible for the semiconductor particles and/or the semiconductor clusters to react with the linker molecules and for the reaction product to be applied to the substrate, for example, in the form of a suspension. The semiconductor particles arranged in the organic semiconductor do not have to be completely crosslinked by linker molecules. It is also possible for some of the semiconductor particles to be crosslinked by linker molecules and for free semiconductor particles to be arranged in the organic semiconductor in addition to the crosslinked semiconductor particles.

The nanoparticles may either be applied directly or it is also possible to produce a solution from a soluble precursor of the particle material and for the nanoparticles in that case only to be produced after deposition, for example, by coagulation.

If the semiconductor particles and/or the semiconductor clusters can only be suspended with difficulty, the semiconductor particles and/or semiconductor clusters may also be surface-functionalized, for example, by alkyl chains being co-ordinatively bonded to the surface of the semiconductor particles and/or semiconductor clusters by means of corresponding functional groups. It is also possible to first activate the surface of the semiconductor particles and/or semiconductor clusters and then to react them with a surface-functionalized compound in order for the surface-functionalized compound to be covalently bonded to the semiconductor particle and/or the semiconductor cluster. The same processes and materials as explained above in connection with the linker molecules can be used for this purpose.

BRIEF DESCRIPTION OF THE DRAWINGS

The invention is explained in more detail below with reference to the appended drawing, and on the basis of examples.

DETAILED DESCRIPTION

Figure 1A:
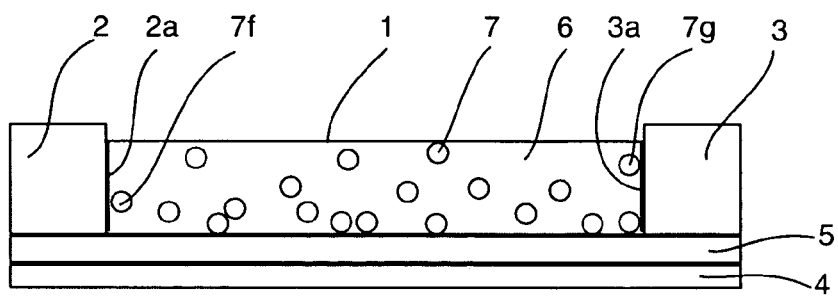
FIGS. 1A and 1B show embodiments of the semiconductor device according to the invention, in which the semiconductor particles are randomly distributed in the organic semiconductor material.
Figure 1B:
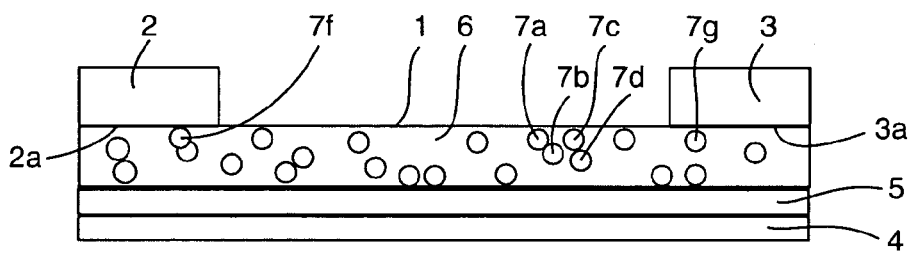

FIGS. 1A and 1B illustrate two embodiments of a transistor which includes a semiconductor path which is arranged between a source electrode 2 and a drain electrode 3. The formation of a charge carrier channel can be controlled by the field of the gate electrode 4, which is insulated from the semiconductor path 1 or source electrode 2 and drain electrode 3 by a dielectric 5. With the arrangement of the transistor shown in FIG. 1A, source electrode 2 and drain electrode 3 together with the semiconductor path 1 are arranged directly on the dielectric, while, on the arrangement shown in FIG. 1B, source electrode 2 and drain electrode 3 are arranged on the layer of the semiconductor path 1 as top electrodes. The semiconductor path 1 is composed of an organic semiconductor material 6 which forms a continuum between the source electrode 2 and the drain electrode 3. Semiconductor particles 7 are embedded in the semiconductor material 6. The semiconductor particles 7 or agglomerates formed from a plurality of semiconductor particles 7a to 7d are arranged isolated from one another. The semiconductor particles 7 are arranged randomly in the volume of the organic semiconductor material 6 or of the semiconductor path 1. The contact resistance for the transfer of charge carriers between source electrode 2 or drain electrode 3 and the organic semiconductor material 6 can be significantly reduced by semiconductor particles 7f, 7g arranged adjacent to the surface 2a of the source electrode 2 or the surface 3a of the drain electrode 3.

Figure 2A:
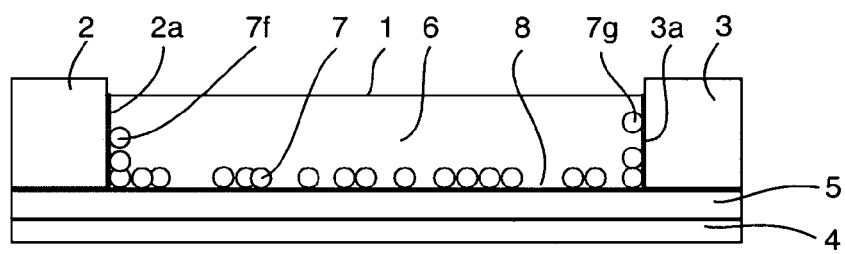
FIGS. 2A and 2B show embodiments of the semiconductor device according to the invention, in which semiconductor particles are arranged along one surface of the semiconductor path.
Figure 2B:
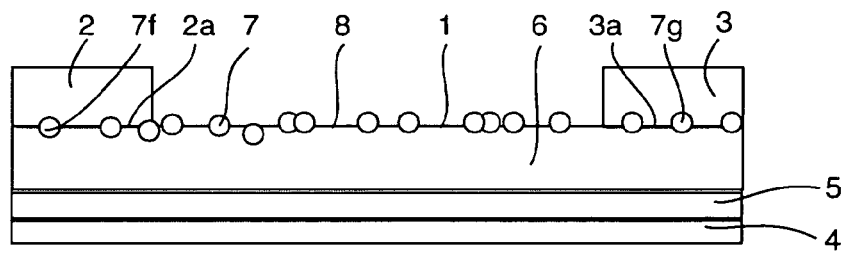

FIGS. 2A and 2B show a further possible arrangement of the semiconductor particles 7 and the organic semiconductor material 6. The structure of the transistors shown in FIG. 2A and 2B corresponds to the structure described in FIG. 1A and 1B. In the embodiment shown in FIGS. 2A and 2B, however, the semiconductor particles 7 are not distributed randomly in the volume of the organic semiconductor material 6, but rather along one surface 8 of the semiconductor path 1. With the embodiment shown in FIG. 2A, the surface 8 corresponds to the interface between organic semiconductor material 6 and the dielectric 5 and also includes the surface sections 2a and 3a which are formed between source electrode 2 and semiconductor path 1 or drain electrode 3 and semiconductor path 1. The semiconductor particles 7 are arranged along this surface, spaced apart from one another.

The semiconductor particles 7f, 7g arranged at the surfaces 2a and 3a once again make it possible to reduce the contact resistance for the transfer of charge carriers between source electrode 2 and semiconductor path 1 or semiconductor path 1 and drain electrode 3. In the embodiment of the transistor which is illustrated in FIG. 2b, the semiconductor particles 7 are arranged along a surface 8 of the semiconductor path 1 which is on the opposite side from the dielectric 5. In this embodiment, the organic semiconductor material 6 is deposited on the dielectric 5 first, and after a layer of the organic semiconductor material 6 has been formed, the semiconductor particles 7 are deposited on the top side of this layer. Finally, source electrode 2 and drain electrode 3 are formed, so that the semiconductor path 1 is supplemented to form a field-effect transistor. In this embodiment too, semiconductor particles 7f, 7g are arranged at the contact surfaces 2a and 3a, in order to reduce the charge transfer between source electrode 2 and organic semiconductor material 6 or organic semiconductor material 6 and drain electrode 3.

Figure 3A:
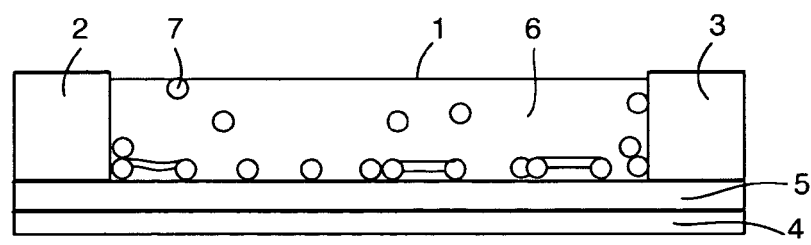
FIGS. 3A and 3B show an embodiment of the semiconductor device according to the invention in which the semiconductor particles are linked by linker molecules.
Figure 3B:
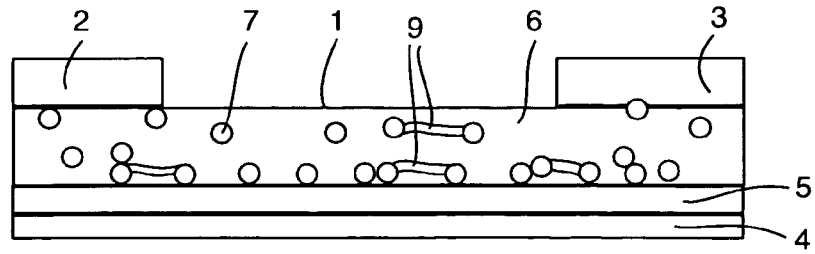

The arrangements of field-effect transistors illustrated in FIGS. 3A and 3B correspond to the arrangements shown in FIGS. 1A and 1B. In this case too, the semi-conductor particles 7 are distributed randomly in the volume of the semiconductor path. In addition, however, linker molecules 9 are provided, covalently linking adjacent semiconductor particles 7. The semiconductor particles 7 and the linker molecules 9 must not form a continuous network.

EXAMPLES

The Si particles used in the above examples were produced using methods as described in the following literature references.
(1) Holleman, Wiberg, Lehrbuch der anorganischen Chemie [Textbook of Inorganic Chemistry], Walter de Gruyter Berlin, New York, 1995;
(2) M. Kauzlarich et al. J. Am. Chem Soc. 1996, 118, 1246f;
(3) U. Hilleringmann, Silizium-Halbleitertechnologie [Silicon Semiconductor Technology] B. G. Teubner Stuttgart, Leipzig, 1999.

Example 1

Surface activation of Si microparticles by hydrogen chloride in the gas phase 10 g of pulverized Si (p-doped, 1.8 Ωcm, grain size <5 μm) are reacted with HCl for 15 minutes at 350° C. This is followed by cooling with nitrogen to room temperature over the course of 30 minutes. The activated particles can be reacted immediately in the reactor or stored under a dry argon atmosphere in an inert, dry solvent (e.g., diethyl glycol).
Yield: 11 g of grey powder

Example 2

Surface activation of Si nanoparticles by hydrogen chloride in the gas phase 8 g of Si nanoparticles (grain size approx. 50 nm) are reacted with HCl for 15 minutes at 350° C. in a fluidized-bed reactor. This is followed by cooling with nitrogen to room temperature over the course of 30 minutes. The activated nanoparticles can be reacted immediately in the reactor or stored under a dry argon atmosphere in an inert, dry solvent (e.g. diethyl glycol).
Yield: 10.5 g of brown powder

Example 3

Surface activation of Si microparticles by silicon tetrachloride in solution 10.1 g (0.36 mol) of pulverized silicon (n-doped, 8.6 Ωcm, grain size <5 μm) are suspended in 300 ml of diethyl glycol and heated with reflux for 72 hours with 61.2 g (0.36 mol) of silicon tetrachloride in a round-bottomed flask apparatus provided with reflux condenser and argon purge. After cooling, the solvent and excess $SiCl_4$ are distilled off under reduced pressure. The activated particles can be stored under a dry argon atmosphere in an inert, dry solvent (e.g., diethyl glycol).

Example 4

Surface activation of silicon nanoparticles by silicon tetrachloride in solution 7.0 g (0.25 mol) of silicon nanoparticles (grain size approx. 50 nm) are suspended in 200 ml of diethyl glycol and heated to boiling for 72 hours with 42.5 g (0.25 mol) of silicon tetrachloride with reflux in a round-bottomed flask apparatus provided with reflux condenser and argon purge. After cooling, the solvent and excess $SiCl_4$ are distilled off under reduced pressure. The activated nanoparticles can be stored under a dry argon atmosphere in an inert, dry solvent (e.g., diethyl glycol).

Example 5

Surface activation of silicon nanoparticles by silicon tetrachloride in solution 1.0 g of potassium silicide (Ksi) is suspended in 80 ml of diethyl glycol and heated to boiling with 3 g (0.25 mol) of silicon tetrachloride for 72 hours with reflux in a round-bottomed flask apparatus provided with reflux condenser and argon purge. After cooling, the solvent and excess $SiCl_4$ are distilled off under reduced pressure. The activated nanoparticles can be stored under a dry argon atmosphere in an inert, dry solvent (e.g., diethyl glycol).

Example 6

Surface functionalization of silicon microparticles by butanol in the gas phase 5 g of the chlorine-activated microparticles obtained in Example 1 are quenched with 300 ml of 1-butanol at 150° C. in the fluidized-bed reactor under a nitrogen atmosphere. After cooling to room temperature, a suspension of butoxy-functionalized microparticles in butanol is obtained, and these microparticles are isolated as a grey-brown powder by washing with water and subsequently drying under reduced pressure.
Yield: 5.5 g, FTIR ν in $cm^{-1}$: 2926, 2855, 1464, 1384

Example 7

Surface functionalization of silicon nanoparticles by butanol in solution 5 g of the chlorine-activated nanoparticles obtained in Example 4 are suspended in 100 ml of diethyl glycol and 10 ml of 1-butanol are slowly added in a round-bottomed flask apparatus provided with reflux condenser and argon purge. This is followed by cooling at room temperature for 12 hours. The mixture is taken up in n-hexane and washed with water three times. The hexane phase is dried and the solvent distilled off under reduced pressure.
Yield: 4.8 g of brown powder; FTIR ν in $cm^{-1}$: 2931, 2857, 1460, 1377

Example 8

Surface functionalization of silicon nanoparticles by phenol in solution 3 g of the chlorine-activated nanoparticles obtained in Example 4 are suspended in 70 ml of diethyl glycol in a round-bottomed flask apparatus provided with reflux condenser and argon purge and slowly mixed with 3 g of phenol. This is followed by stirring at room temperature for 12 hours. The mixture is taken up in toluene and washed with water three times. The organic phase is dried and the solvent distilled off.

Yield: 3.1 g of brown powder; FTIR $\nu$ in $cm^{-1}$: 3031, 1588, 1498, 1198

Example 9

Surface functionalization of silicon nanoparticles by butyllithium in solution 4 g of the chlorine-activated nanoparticles obtained in Example 2 are suspended in 70 ml of diethyl glycol in a round-bottomed flask apparatus provided with reflux condenser and argon purge and slowly mixed with 12 ml of 2.5 M butyllithium in hexane. This is followed by stirring at room temperature for 12 hours. The mixture is taken up in hexane and washed with water three times. The organic phase is dried and the solvent distilled off.

Yield: 3.4 g of brown powder; FTIR $\nu$ in $cm^{-1}$: 2957, 2929, 2858, 1465, 1378

Example 10

Surface functionalization of silicon microparticles by hexylmagnesium bromide in solution 3 g of the chlorine-activated microparticles obtained in Example 3 are suspended in 70 ml of diethyl glycol in a round-bottomed flask apparatus provided with reflux condenser and argon purge and slowly mixed with 10 ml of 2.0 M hexylmagnesium bromide in ether. This is followed by stirring at room temperature for 12 hours. The mixture is filtered and washed with water three times and with methanol twice. After drying under reduced pressure, 2.7 g of grey powder are obtained.

FTIR $\nu$ in $cm^{-1}$: 2967, 2933, 2868, 1460, 1365

Example 11

Covalent linking of silicon nanoparticles by 1,4-butanediol in solution 5 g of the chlorine-activated nanoparticles obtained in Example 4 are suspended in 100 ml of diethyl glycol in a round-bottomed flask apparatus provided with reflux condenser and argon purge and are slowly mixed with 10 ml of 1,4-butanediol. This is followed by stirring at room temperature for 12 hours. The mixture is filtered and the residue washed with water three times and with methanol twice. After drying in vacuo, 5.1 g of brown powder are obtained.

FTIR $\nu$ in $cm^{-1}$: 3300, 2951, 2923, 2878, 1460, 1365, 1098

Example 12

Covalent linking of silicon nanoparticles by hydroquinone in solution 4 g of the chlorine-activated nanoparticles obtained in Example 4 are suspended in 100 ml of diethyl glycol in a round-bottomed flask apparatus equipped with reflux condenser and argon purge and are slowly mixed with 2.6 g of hydroquinone. This is followed by stirring at room temperature for 12 hours. The mixture is filtered and washed with water three times and twice with ethanol. After drying in vacuo, 4.5 g of brown powder are obtained.

FTIR $\nu$ in $cm^{-1}$: 3520, 3031, 1680, 1581, 1488, 1193

Example 13

Covalent linking of silicon microparticles by 1,4-dimercaptobutane in the gas phase 5 g of the chlorine-activated microparticles obtained in Example 1 are quenched with 15 ml of 1,4-dimercaptobutane at 150° C. in the fluidized-bed reactor under a nitrogen atmosphere. After cooling to room temperature, the product is washed with 100 ml of diethyl glycol from the reactor cell. A grey-brown powder is isolated by washing with water and subsequent drying in vacuo:

Yield: 5.5 g; FTIR $\nu$ in $cm^{-1}$: 3420, 2940, 2865, 1474, 1374

Example 14

Surface functionalization of silicon nanoparticles by hexylmagnesium bromide in solution 0.5 g of the chlorine-activated nanoparticles obtained in Example 5 is suspended in 50 ml of diethyl glycol in a round-bottomed flask apparatus provided with reflux condenser and argon purge and is slowly mixed with 3 ml of 2.0 M hexylmagnesium bromide in ether. This is followed by stirring at room temperature for 12 hours. The mixture is filtered and extracted three times with water and twice with n-hexane. After the hexane phase has been dried and the solvent distilled off under reduced pressure, 80 mg of brown powder are obtained.

FTIR $\nu$ in $cm^{-1}$: 2957, 2923, 2858, 1460, 1458

Example 15

Production of a film comprising inorganic semiconducting microparticles in an organic semiconductor 20 mg of pulverized silicon (p-doped, 1.8 $\Omega$cm, grain size <5 µm) are suspended in a solution of 20 mg of poly-3-hexylthiophene-2,5-diyl in 2.5 ml of chloroform. The suspension is applied to a silicon wafer, which has been prepared by the formation of transistor structures (bottom contact), using a syringe and centrifuged at 2000 revolutions per minute. The film is then conditioned at 75° C. under a nitrogen atmosphere for 4 minutes.

Example 16

Producing a film including inorganic semiconducting nanoparticles in an organic semiconductor 20 mg of the butyl-functionalized silicon nanoparticles obtained in Example 12 are dissolved in a solution of 20 mg of poly-3-hexylthiophene-2,5-diyl in 2.5 ml of chloroform. The solution is applied to a silicon wafer, which has been prepared by the formation of transistor structures (bottom contact), using a syringe and centrifuged at 2000 revolutions per minute. The film is then conditioned at 75° C. under a nitrogen atmosphere for 4 minutes.

Example 17

Producing a film including inorganic semiconducting nanoparticles in an organic semiconductor 20 mg of the hexyl-functionalized silicon nanoparticles obtained in Example 14 are dissolved in a solution of 20 mg of poly-3-hexylthiophene-2,5-diyl in 2.5 ml of chloroform. The solution is applied to a silicon wafer, which has been prepared by the formation of transistor structures (bottom contact), using a syringe and centrifuged at 2000 rpm. Then, the film is conditioned at 75° C. under a nitrogen atmosphere for 4 minutes.

Example 18

Producing a film including a mixture of inorganic semiconducting nanoparticles in organic semiconductors 40 mg of the hexyl-functionalized silicon nanoparticles obtained in Example 14 are dissolved in a solution of 20 mg of poly-3-hexylthiophene-2,5-diyl in 3.5 ml of chloroform. The solution is applied to a silicon wafer, which has been prepared by the formation of transistor structures (bottom contact), using a syringe and centrifuged at 2000 rpm. The film is then conditioned at 75° C. under a nitrogen atmosphere for 4 minutes.

Example 19

Producing a film including a mixture of inorganic semiconducting nanoparticles and organic semiconductors 10 mg of the hexyl-functionalized silicon nanoparticles obtained in Example 14 are dissolved in a solution of 20 mg of poly-3-hexylthiophene-2,5-diyl in 2 ml of chloroform. The solution is applied to a silicon wafer, which has been prepared by the formation of transistor structures (bottom contact), using a syringe and centrifuged at 2000 rpm. Then, the film is conditioned at 75° C. under a nitrogen atmosphere for 4 minutes.

Example 20

Producing a film including a mixture of inorganic semiconducting microparticles and organic semiconductors 20 mg of the hexyl-functionalized silicon microparticles obtained in Example 10 are suspended in a solution of 20 mg of poly-3-hexylthiophene-2,5-diyl in 2.5 ml of chloroform. This suspension is applied to a silicon wafer, which has been prepared by the formation of transistor structures (bottom contact), using a syringe and centrifuged at 2000 rpm. The film is then conditioned at 50° C. under a nitrogen atmosphere for 4 minutes.

Example 21

Producing a film by building up layers One millilitre of a solution of 20 mg of the hexyl-functionalized silicon nanoparticles obtained in Example 14 in 1.5 ml of chloroform is applied to a silicon wafer, which has been prepared by the formation of transistor structures (bottom contact), using a syringe and centrifuged at 2000 rpm. The film is then conditioned at 75° C. under a nitrogen atmosphere for 4 minutes. Then, one millilitre of a solution of 20 mg of poly-3-hexylthiophene-2,5-diyl in 2.5 ml of chloroform is applied to this layer and centrifuged at 2000 rpm. The film is then conditioned at 75° C. for 4 minutes under a nitrogen atmosphere.

Example 22

Producing a film with a layer structure One millilitre of a solution of 20 mg of the butyl-functionalized silicon nanoparticles obtained in Example 12, dissolved in 1.5 ml of chloroform, is applied to a silicon wafer, which has been prepared by the formation of transistor structures (bottom contact), using a syringe and centrifuged at 2000 rpm. Then, the film is conditioned at 75° C. under a nitrogen atmosphere for 4 minutes. Following this, one millilitre of a solution of 20 mg of poly-3-hexylthiophene-2,5-diyl in 2.5 ml of chloroform is applied to this layer and centrifuged at 2000 rpm. The film is then conditioned at 75° C. in a nitrogen atmosphere for 4 minutes.

Example 23

The current-voltage characteristic curves are determined for the field-effect transistors fabricated in Examples 17 to 19. For comparison purposes, the characteristic curve of a transistor which contained poly-3-hexylthiophene-2,5-diyl (PHT) as active component without the addition of inorganic particles was determined.

Figure 4:
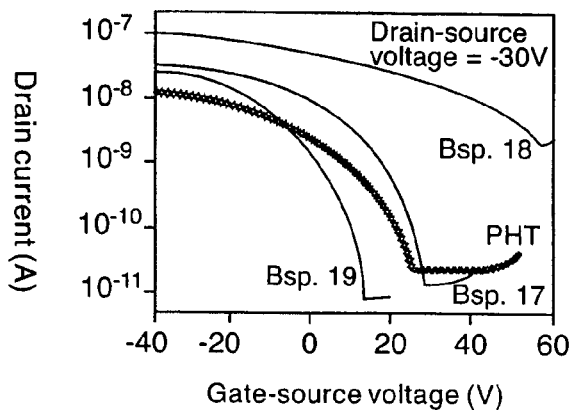
FIG. 4 shows a graph illustrating current-voltage characteristic curves of organic field-effect transistors.

The characteristic curves are plotted in FIG. 4. This figure shows an improvement in the transistor properties compared to PHT, and these properties are therefore dependent on the stoichiometry of the mixtures.

Example 24

Figure 5:
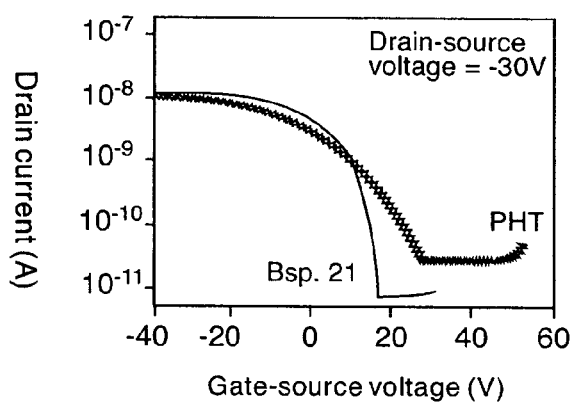
FIG. 5 shows a current-voltage characteristic curve of an organic field-effect transistor.

The current-voltage characteristic curves of the field-effect transistor fabricated in Example 21 and, for comparison purposes, the characteristic curve of a transistor with poly-3-hexylthiophene-2,5-diyl (PHT) as active component without the addition of inorganic particles, which had been fabricated under the same conditions, were determined. The current-voltage characteristic curve is plotted in FIG. 5.

Example 25

Determination of the charge carrier mobility

Figure 6:
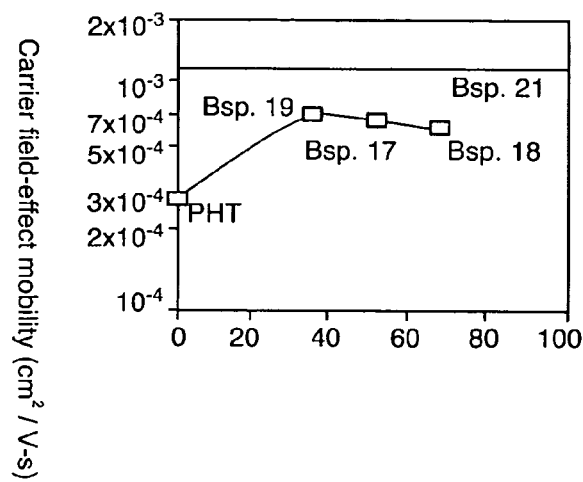
FIG. 6 shows a graph illustrating the charge carrier mobility for various field-effect transistors.

The mobilities of the charge carriers were determined for the field-effect transistors used in Examples 23 and 24. A field-effect transistor which comprises poly-3-hexylthiophene-2,5-diyl (PHT) as active component without the addition of inorganic particles was used for comparison purposes. The charge carrier mobilities are plotted in FIG. 6. In all the cases described, the charge carrier mobilities are improved by at least a factor of 2.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. A semiconductor device comprising:
   a semiconductor path made from an organic semiconductor material;
   a first contact for injection of charge carriers into the semiconductor path; and
   a second contact for extraction of charge carriers from the semiconductor path, semiconductor particles and/or semiconductor clusters present in the organic semiconductor material along the semiconductor path, the semiconductor particles comprising an inorganic semiconductor material and the semiconductor clusters being defined as compounds comprising at least three metal atoms, each of the metal atoms being chemically linked to at least two other metal atoms via a metal-metal bond, wherein the semiconductor particles and/or the semiconductor clusters are modified at a respective surface by alkyl chains.

2. The semiconductor device according to claim 1, wherein the semiconductor particles and/or the semiconductor clusters are randomly distributed in the volume of the organic semiconductor material.

3. The semiconductor device according to claim 1, wherein the semiconductor particles and/or the semiconductor clusters are arranged substantially at one surface along the semiconductor path made from the organic semiconductor material.

4. A semiconductor device, comprising:
a semiconductor path made from an organic semiconductor material;
a first contact for injection of charge carriers into the semiconductor path; and
a second contact for extraction of charge carriers from the semiconductor path, semiconductor particles and/or semiconductor clusters present in the organic semiconductor material along the semiconductor path, the semiconductor particles comprising an inorganic semiconductor material and the semiconductor clusters being defined as compounds comprising at least three metal atoms, each of the metal atoms being chemically linked to at least two other metal atoms via a metal-metal bond, wherein the semiconductor particles and/or the semiconductor clusters are bonded by linker molecules.

5. The semiconductor device according to claim 4, wherein the linker molecules are bonded to the semiconductor particle and/or the semiconductor cluster by a covalent bond.

6. The semiconductor device according to claim 1, wherein the semiconductor particles and/or the semiconductor clusters are arranged in isolated positions or as isolated agglomerates of semiconductor particles and/or semiconductor clusters in the organic semiconductor material.

7. The semiconductor device according to claim 1, wherein the semiconductor particles and/or the semiconductor clusters form less than 20% by volume of the semiconductor path.

8. The semiconductor device according to claim 1, wherein the semiconductor path is supplemented by a source electrode, a drain electrode and a gate electrode to form a transistor.

9. The semiconductor device according to claim 4, wherein the semiconductor particles and/or the semiconductor clusters are randomly distributed in the volume of the organic semiconductor material.

10. The semiconductor device according to claim 4, wherein the semiconductor particles and/or the semiconductor clusters are arranged substantially at one surface along the semiconductor path made from the organic semiconductor material.

11. The semiconductor device according to claim 4, wherein the semiconductor particles and/or the semiconductor clusters form less than 20% by volume of the semiconductor path.

12. The semiconductor device according to claim 4, wherein the semiconductor particles and/or the semiconductor clusters are arranged in isolated positions or as isolated agglomerates of semiconductor particles and/or semiconductor clusters in the organic semiconductor material.

13. The semiconductor device according to claim 4, wherein the semiconductor path is supplemented by a source electrode, a drain electrode, and a gate electrode to form a transistor.

* * * * *